US 7,838,956 B2

(12) United States Patent
McCarten et al.

(10) Patent No.: US 7,838,956 B2
(45) Date of Patent: Nov. 23, 2010

(54) BACK ILLUMINATED SENSOR WITH LOW CROSSTALK

(75) Inventors: John P. McCarten, Penfield, NY (US); Joseph R. Summa, Hilton, NY (US); Cristian A. Tivarus, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 58 days.

(21) Appl. No.: 12/336,797

(22) Filed: Dec. 17, 2008

(65) Prior Publication Data

US 2010/0148289 A1 Jun. 17, 2010

(51) Int. Cl.
*H01L 31/00* (2006.01)

(52) U.S. Cl. .......................................... 257/447; 257/59

(58) Field of Classification Search ................ 257/432, 257/447, E31.052, E31.127, 59, 72, 222; 438/73, 144, 710
See application file for complete search history.

(56) References Cited

U.S. PATENT DOCUMENTS

2007/0108371 A1  5/2007  Stevens et al.
2008/0131588 A1*  6/2008  Hwang et al. ................ 427/74
2008/0265348 A1* 10/2008  Maas et al. .................. 257/432

OTHER PUBLICATIONS

Shorties et al., IEDM, New York, 1071, p. 415.
Pain, A back-Illuminated Megapixel CMOS Image Sensor, IEEE Workshop on Charge-Coupled Devices and Advanced Image Sensors, Japan, Jun. 9-11, 2005.
Stern, Proc. SPIE, vol. 1447, 1989, pp. 43-57.
Lesser, Proc. SPIE, vol. 1447, 1991, pp. 177-182.
Levine, Proc. SPIE, vol. 2172, 1994, pp. 100-114.
Burke, 7995 IEEE Workshop on charge coupled devices and advanced image sensors.
Hoenk et al., Appl. Phys. Lett., vol. 61, 1992, 1084-1086.
Plummer et al., Silicon VLSI Technology, Fundamentals, Practice, and Modeling, Chapter 2.

* cited by examiner

*Primary Examiner*—Thomas L Dickey
*Assistant Examiner*—Nikolay Yushin
(74) *Attorney, Agent, or Firm*—Nancy R. Simon

(57) ABSTRACT

A back-illuminated image sensor includes a sensor layer having a frontside and a backside opposite the frontside. An insulating layer is situated adjacent the backside and a circuit layer is adjacent the frontside. A plurality of photodetectors of a first type conductivity convert light incident on the backside into photo-generated charges. The photodetectors are disposed in the sensor layer adjacent the frontside. A region of a second type conductivity is formed in at least a portion of the sensor layer adjacent the frontside and is connected to a voltage terminal for biasing the second type conductivity region at a predetermined voltage. A well of the second type conductivity is formed in the sensor layer adjacent the backside. Trench isolations in the sensor layer start at the frontside and extend beyond the depletion region of the photodiodes.

13 Claims, 10 Drawing Sheets

BACK ILLUMINATED SENSOR WITH LOW CROSSTALK

FIELD OF THE INVENTION

The present invention relates generally to image sensors, and more particularly to back-illuminated image sensors.

BACKGROUND OF THE INVENTION

An electronic image sensor captures images using light-sensitive photodetectors that convert incident light into electrical signals. Image sensors are generally classified as either front-illuminated image sensors or back-illuminated image sensors. FIG. 1 is a simplified cross-section of a front-illuminated image sensor through three pixels 101, 102, 103. The illustrated image sensor 100 is a pmos image sensor, which includes pixels 101, 102, 103 formed within a p++ substrate 2 on p-epi silicon layer 3. Photodetectors 91, 92, 93 are formed within this sensor layer 4. An n-type pinning layer 27 is formed over each photodetector 91, 92, 93. One or more shallow trench isolation (STI) regions 5 are formed within each pixel 101, 102, 103. A different n-type pinning layer 26 lines the STI trench, the purpose of which is to reduce dark current generation due to dangle silicon bonds along the STI sidewalls.

A transfer gate 10 is used to transfer the collected photo-generated charges 31 from the photodetector 91 to a charge-to-voltage converter 28. The illustrated charge-to-voltage converter 28 is configured as a floating diffusion. The converter 28 converts the charge into a voltage signal. Transistors within the pixel array (see FIG. 2) amplify this voltage signal and relay the information to external circuitry where the image is further processed. Referring to FIG. 2, a source-follower transistor 173 buffers the voltage signal stored in the charge-to-voltage converter 28. A reset transistor 172 is used to reset the converter 28 to a known potential prior to pixel readout. The output voltage from the source-follower 174 drives a column line that is connected to external circuitry at the periphery of the imager.

Returning to FIG. 1 the charge-to-voltage converter 28 resides in a shallow n-well 29 that isolates the p+ converter 28 from the photodiode 91 and substrate 2. The shallow n-well 29 is biased to a known voltage level VDD through a well contact 37. VDD also biases the n-type pinning layer 27, the n-type pinning layer 26 that lines the STI trench, and the deep n-well 21. The deep n-well 21 is electrically connected to the shallow n-well 29 by the additional n-type implant 30. Biasing both the shallow n-well 29 and deep n-well 21 to a known potential with respect to ground steers the photo-generated charges 31 into the photodetector 91. Biasing both wells performs the additional function of dramatically reducing electrical crosstalk. For example, photo-generated charges 33 below the position where the electric field is zero, commonly referred to as the vertical overflow drain position (dashed line 8) are swept into the substrate. The vertical overflow drain nearly eliminates electrical crosstalk by preventing photo-generated charges from diffusing into adjacent pixels, and therefore improving MTF performance of the device.

The well contact 37 is positioned at the periphery of the image sensor. Other n-well contacts are periodically spaced throughout imaging area (not shown) to reduce the effective resistance of the wells 21, 29 and to reduce or eliminate well bounce.

For the front-illuminated image sensor of FIG. 1, conductive interconnects 51, 52, 53, such as gates and connectors, are formed in a circuit layer 50. Unfortunately, the positioning of conductive interconnects 51, 52, 53, and various other features associated with the circuit layer 50, over the photodetectors 91, 92, 93 adversely impacts the fill factor and quantum efficiency of the image sensor 100. This is because light 19 from a subject scene must pass through circuit layer 50 before striking the front silicon surface 9 and is detected by photodetectors 91, 92, 93.

FIG. 3 illustrates a cross-sectional view of a portion of the standard CMOS circuitry that resides at the periphery of the image sensor. The standard PMOS 142 and NMOS 143 transistors, and their associated shallow n-well 140 and p-well 141 implants are unaffected by the deep well implant 21 (FIG. 1) in the imaging area (pixels 101, 102, 103 of FIG. 1). The p-type 142 and n-type 143 transistors in the CMOS circuitry outside of imaging area are fabricated using the standard CMOS process flow. During fabrication of the color filter array, the CMOS circuitry is protected from back illumination by an opaque lightshield (not shown). The lightshield can be metal, a stacked layer of red, green, and blue color filter array material, or a unique light absorbing material.

FIG. 4 illustrates a cross-section of a back-illuminated image sensor. Back illumination addresses the fill factor and quantum efficiency issues by constructing the image sensor such that the light from a subject scene is incident on a backside of a sensor layer. The "frontside" 9 of sensor layer 213 is conventionally known as the side of sensor layer 213 that abuts the circuit layer 50, while the "backside" 250 is the side of the sensor layer 213 that opposes the frontside 9. Typically, the circuit layer 50 is attached to a support substrate (not shown). This backside configuration allows light 219 to strike the backside 250 of the sensor layer 213, where it is detected by the photodetectors 91, 92, 93. The detection of light 219 by photodetectors 91, 92, 93 is no longer impacted by the metallization level 51, 52, 53, interconnects 37, and other features of the circuit layer such as the gates 10.

In an effort to increase the number of pixels provided in an image sensor, pixel size has been decreasing. An advantage of moving to smaller pixels is that it increases the resolution of the image for a fixed optical format. Specifically, smaller pixels have a better modulation transfer function (MTF), and can thus discriminate fine details in an image, such as the lines on a finely striped shirt. However, as illustrated in FIG. 4, reducing the size of the pixel for a backside configuration does not improve MTF performance linearly. Unlike a front side illuminated PMOS pixel there is no vertical overflow drain (reference 8 in FIG. 1). Therefore, photocarriers 233 generated in the deep n-well region 221 can diffuse into adjacent pixels. Near room temperature, photocarriers can diffuse against electric fields of less than 1000 V/cm in magnitude with significant probability. The line defined by electric fields of 1000 V/cm in magnitude is defined as the depletion edge boundary 211, and roughly defines the collection region of a given photodiode 91, 92, 93. Low electric field regions exist both between photodiodes, and between the backside Si/SiO2 interface 250 and the depletion edge boundary 211.

This lateral diffusion degrades the electrical portion of the MTF. The lateral mixing increases with decreasing pixel size, increasing the probability that these photo-induced charge carriers 233 in the low electric field region 215 are collected by the charge collection region 211 of an adjacent pixel. More importantly, for color parts, this can produce color mixing between pixels, and thus degrade image quality.

There is a separate problem with the backside configuration illustrated in FIG. 4. The n-well contact 37 does not make continuous electrical connection to the deep n-well 221. FIG. 5 shows a method for contacting the deep n-well 321 with additional n-type implants 340, 341, 342. However, deeper implants (340 is shallower than 341 which is shallower than 342) have greater lateral straggle. This pinches off the depletion region of the photodiode 311, resulting in a shallower collection depth.

Thus, a need exists for an improved image sensor structure.

SUMMARY OF THE INVENTION

A back-illuminated image sensor includes a sensor layer having a frontside and a backside opposite the frontside. An insulating layer is situated adjacent the backside and a circuit layer is adjacent the frontside. A plurality of photodetectors of a first type conductivity convert light incident on the backside into photo-generated charges. The photodetectors are disposed in the sensor layer adjacent the frontside. A region of a second type conductivity is formed in at least a portion of the sensor layer adjacent the frontside and is connected to a voltage terminal for biasing the second type conductivity region at a predetermined voltage. A well of the second type conductivity is formed in the sensor layer adjacent the backside. Trench isolations in the sensor layer start at the frontside and extend beyond the depletion region of the photodiodes.

The present invention has the advantage of providing an image sensor with improved cross talk performance.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION OF THE INVENTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 6:
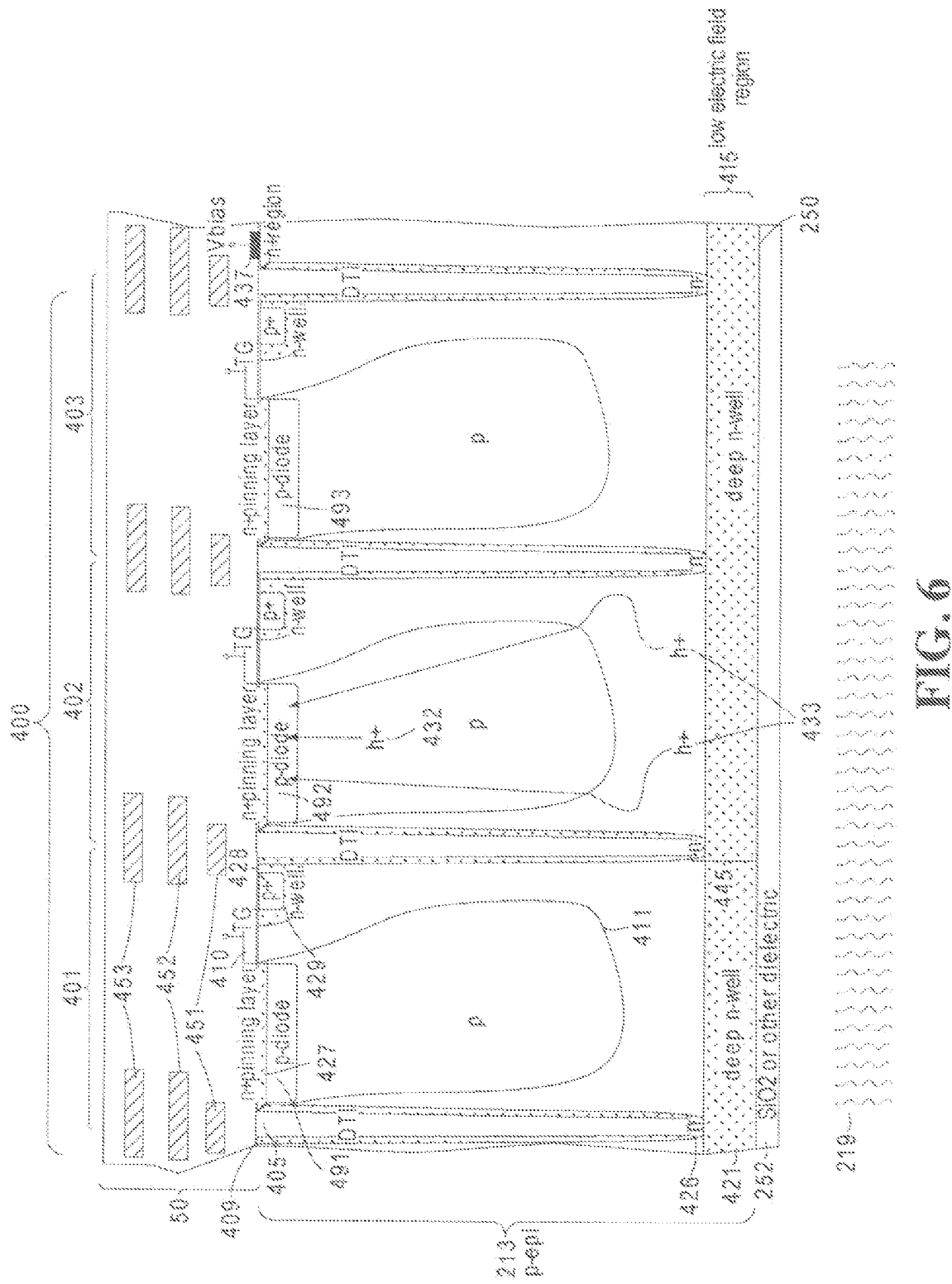
FIG. 6 is a cross-section view illustrating a portion of a back-illuminated image sensor in accordance with embodiments of the invention.

FIG. 6 illustrates a cross-sectional view of a pixel structure in an embodiment of a back-illuminated image sensor 400. The cross-section is through three example pixels 401, 402, 403 of the image sensor 400. The image sensor layer 400 includes an active silicon sensor layer 213 with a frontside 409 and a backside 250 opposite the frontside 409. An insulating layer 252 is situated adjacent the backside 250 and a circuit layer 50 is adjacent the frontside 409, such that the sensor layer 213 is situated between the circuit layer 50 and the insulating layer 252. In the illustrated embodiment, the insulating layer 252 is fabricated of silicon dioxide (SiO2) or another suitable dielectric material. The circuit layer 50 includes conductive interconnects 451, 452, 453, such as gates and connectors that form control circuitry for the image sensor 400.

Each of the pixels 401, 402, 403 includes a respective photodiode 491, 492, 493 of a first type conductivity for converting light 219 incident on the backside 205 into photo-generated charges. In the illustrated embodiment, the photodiodes 491, 492, 493 are formed in a p-epi substrate and are disposed in the sensor layer 213 adjacent the frontside 409.

Referring to the pixel 401, for example, a transfer gate 410 is used to transfer collected photo-generated charges from the photodetector 491 to a charge-to-voltage converter 428, which is configured as a floating diffusion in the illustrated embodiment.

A region of a second type conductivity is formed in at least a portion of the sensor layer 213 adjacent the frontside 409 and is connected to a voltage terminal 437 for biasing the second type conductivity region at a predetermined voltage. In the illustrated embodiment, this well of the second type conductivity is a shallow n-well 429. The converter 428, which converts the charge into a voltage signal, is situated in the shallow n-well 429, which is biased to a known voltage level VDD through the voltage terminal 437, which is n-well contact 437 in some embodiments. A well of the second type conductivity, which is a deep n-well 421 in some embodiments, is formed in the sensor layer 213 adjacent the backside 250.

Deep trench isolations (DTI) 405 start at the frontside 409 and extend beyond a depletion region 411 of the photodiodes 491, 492, 493. Since photogenerated carriers cannot diffuse through the DTI 405, the DTI reduces crosstalk. The only path for electrical crosstalk is now through the narrow region 445 between the bottom of the DTI 405 and the backside surface 250.

Figure 1:
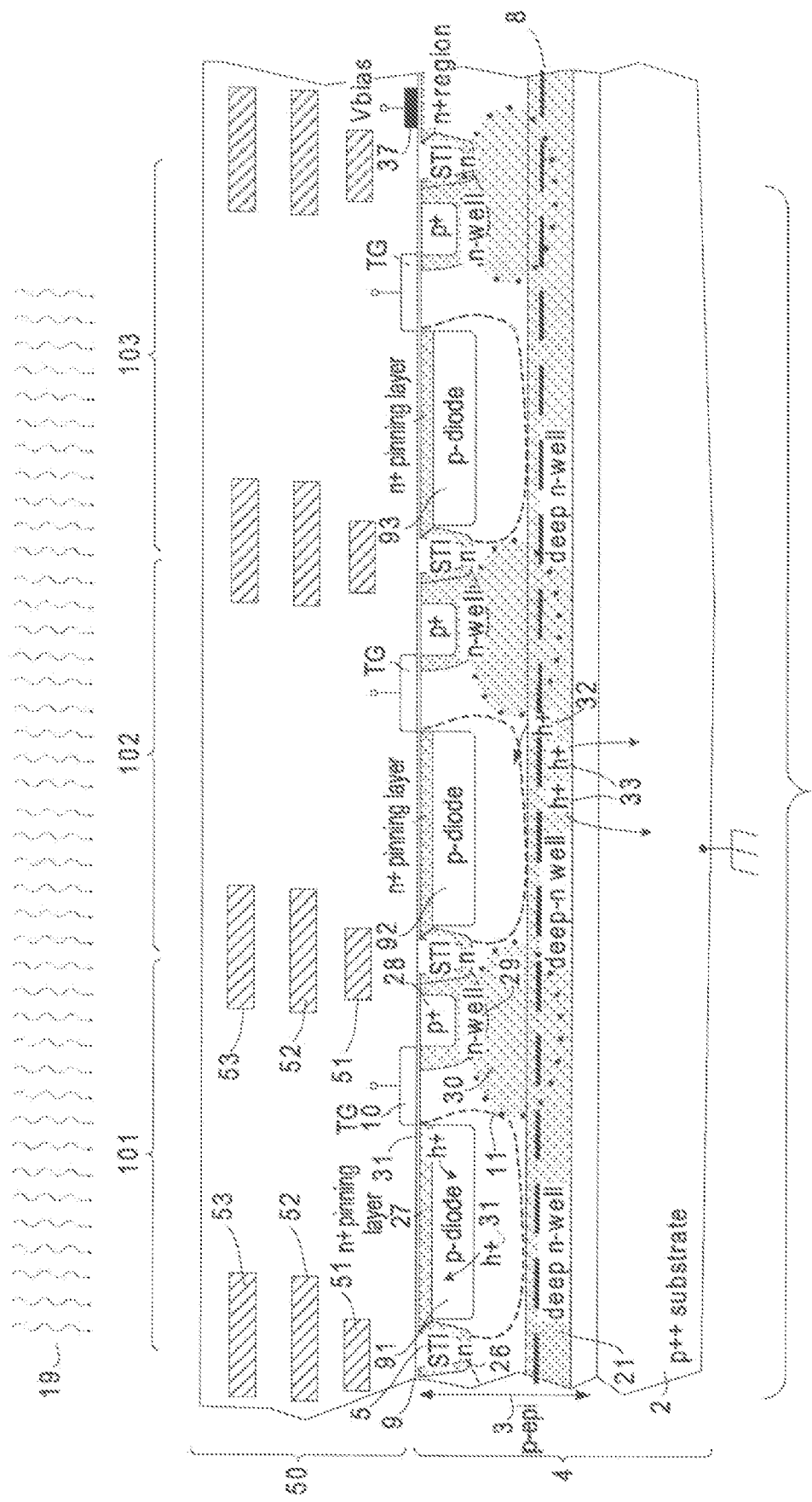
FIG. 1 illustrates a simplified cross-sectional illustration of a frontside illuminated image sensor.
Figure 2:
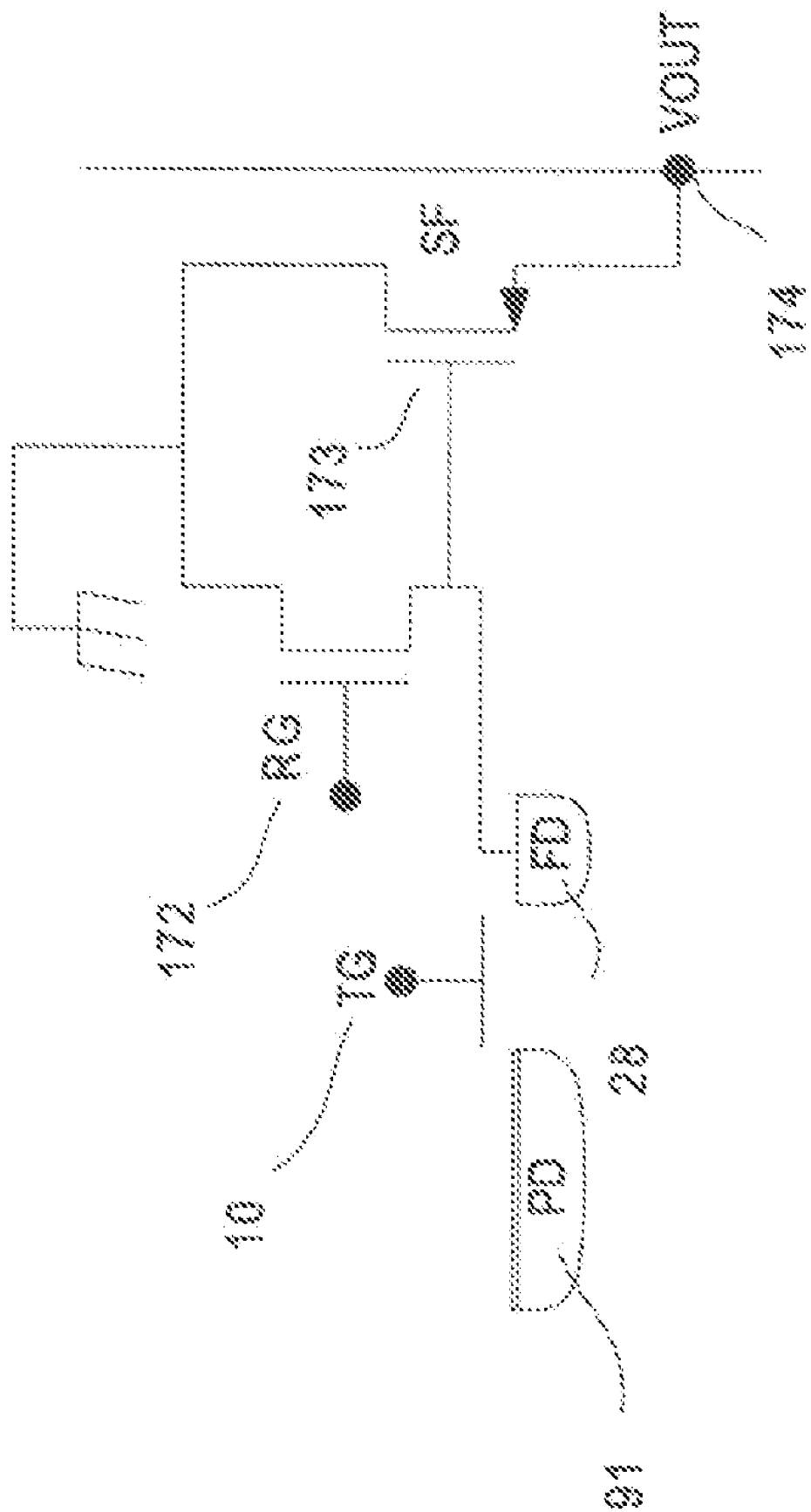
FIG. 2 is a schematic diagram illustrating a non-shared pixel.
Figure 3:
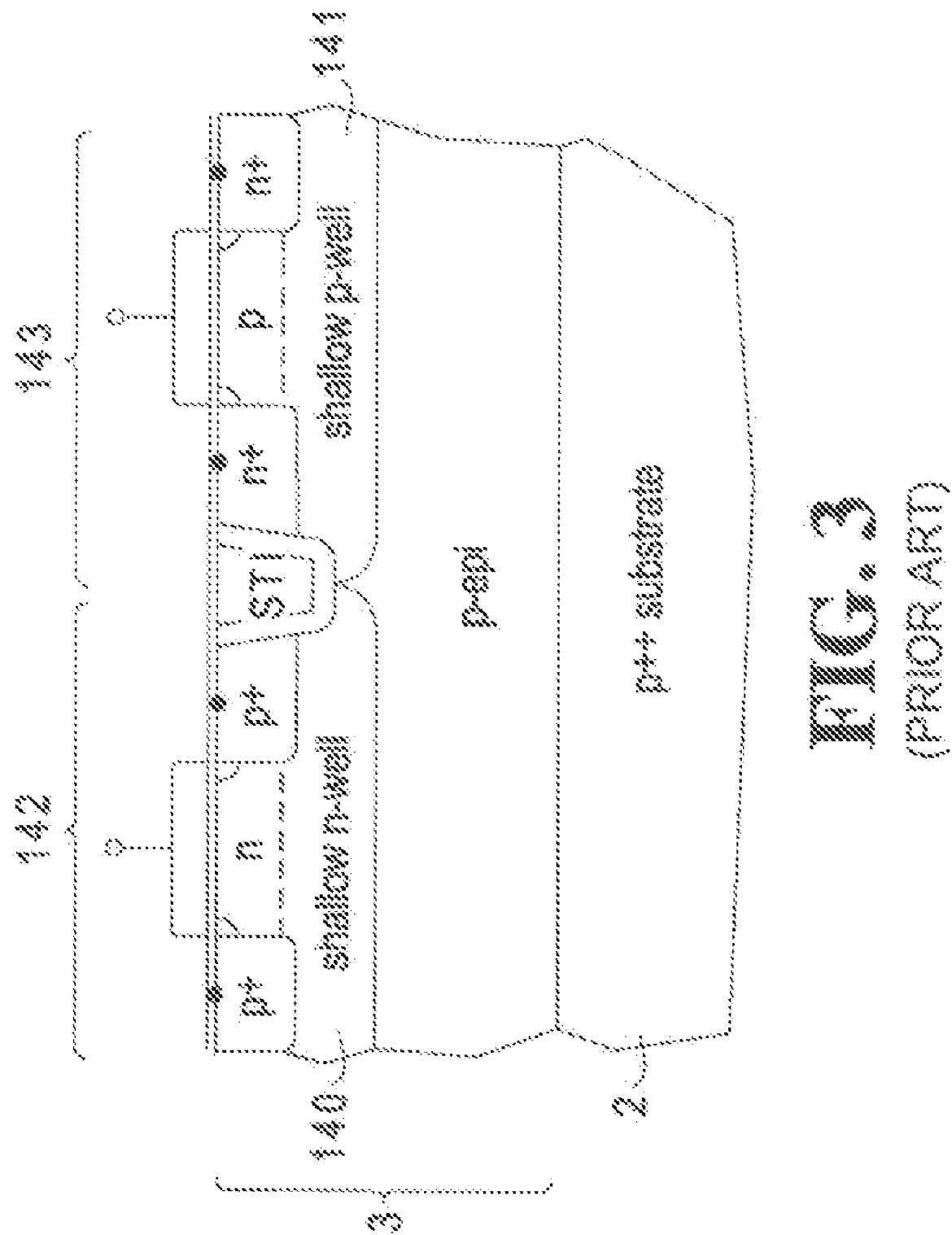
FIG. 3 is a cross-sectional view illustrating of a portion of a standard CMOS circuitry for an image sensor.
Figure 4:
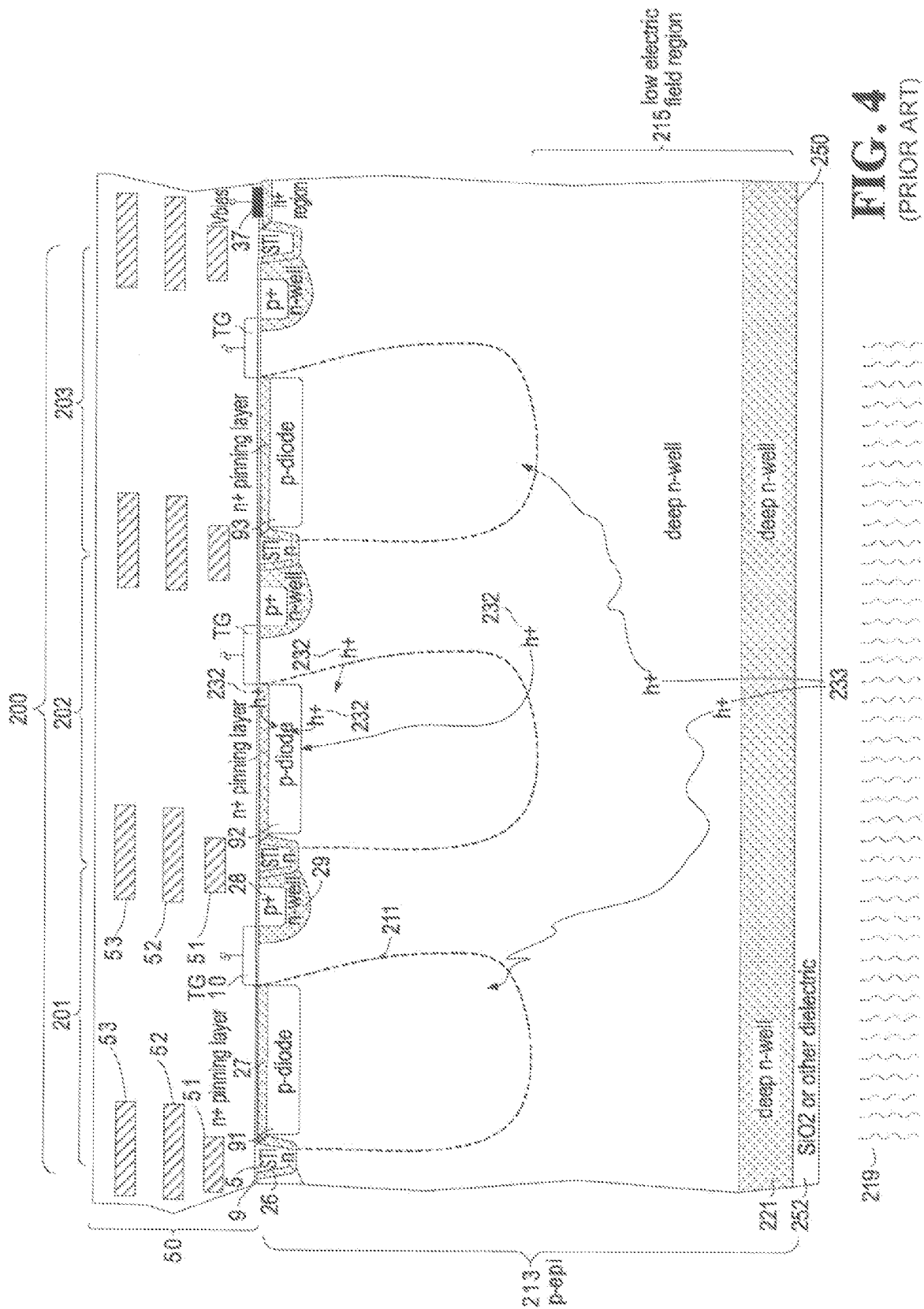
FIG. 4 is a cross-section view illustrating a typical back-illuminated image sensor.
Figure 5:
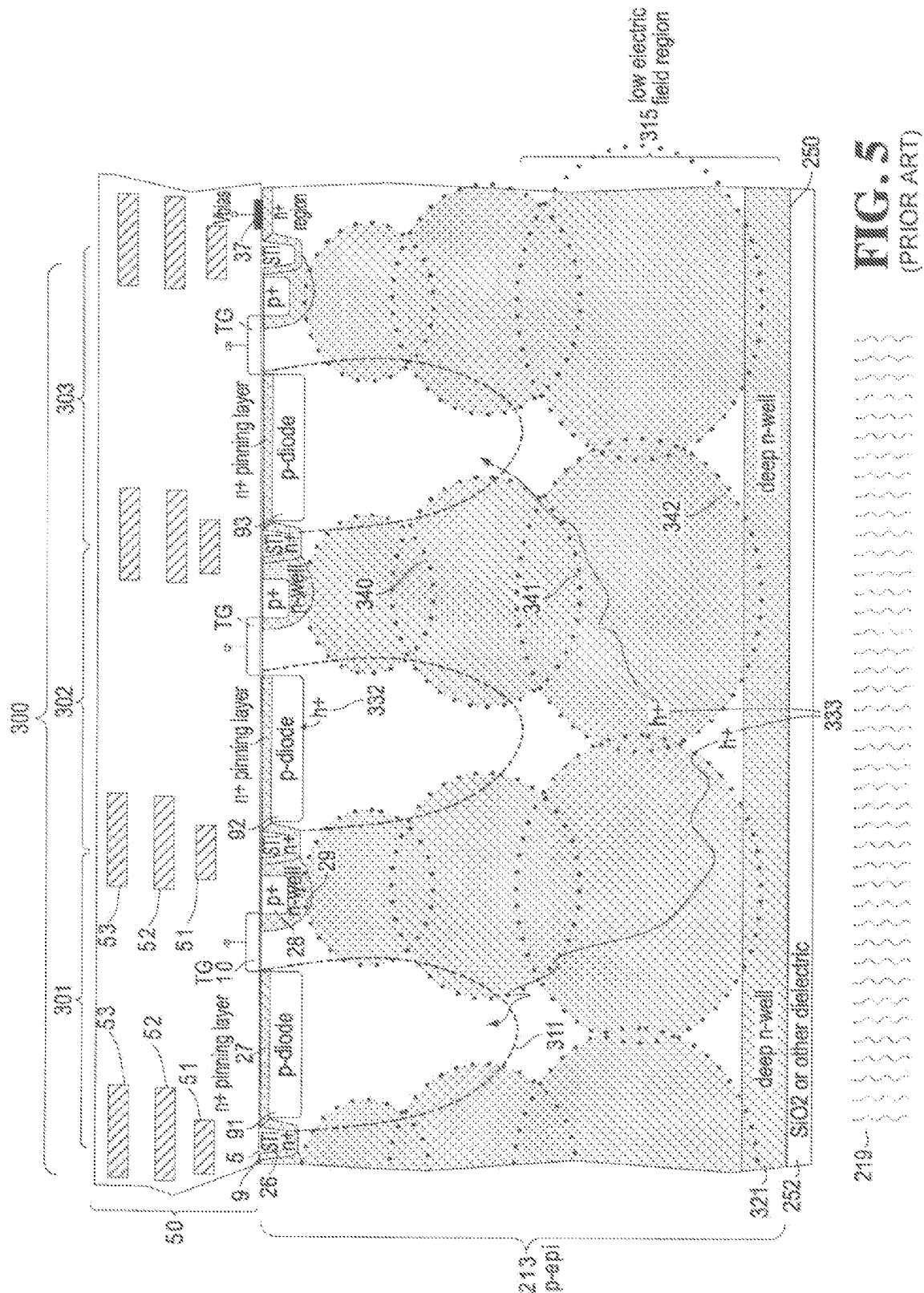
FIG. 5 is a cross-section view illustrating a typical back-illuminated image sensor with patterned n-type implants to electrically connect the n+ contact to the deep n-well.
Figure 7:
FIG. 7 is a plan view illustrating a portion of a back-illuminated image sensor in accordance with further embodiments of the invention.

A thin layer of n-type dopant 426 lines, or encapsulates the DTI 405, and connects the n-well 429 and contact 437 at the frontside 409 and with the deep n-well 421 at the backside 250. This n-type lining 426 serves two primary purposes. First, the n-type dopant 426 reduces dark current generation due to dangle silicon bonds along the DTI sidewalls by making sure the depletion region 411 does not punch through and contact the DTI sidewall. Second, the n-type dopant provides a continuous electrical path between the n-well contact 437 and the deep n-well 421. Unlike the multiple implant configuration 340, 341, 342 of FIG. 5, the embodiment illustrated in FIG. 6 does not significantly pinch-off the depletion region 411. A suitable method for lining the DTI with n-type dopant includes providing a series of angled implants just after the DTI 405 is etched, and each implant at a slightly different angle direct at different portions of the side wall FIG. 7 illustrates a plan view of another pixel structure in an embodiment in accordance with the invention. This pixel structure uses fill trench isolation (FTI). The FTI extends through the active silicon layer 213, reaching the backside dielectric layer 252. (see FIGS. 8 and 9). For illustrative purposes, this structure contains one n-well contact 537 for every two photodiodes 591, 592. A single pixel consists of a photodiode 592, transfer gate 510, floating diffusion 528, reset gate 572, source/follower gate 573, and source/follower output 574. Dotted areas 505 identify the FTI regions. The dashed line 580 illustrates that the pixels are not completely surrounded by the FTI 505, therefore a continuous path exists between pixels in both the x-and y-directions.

Figure 8:
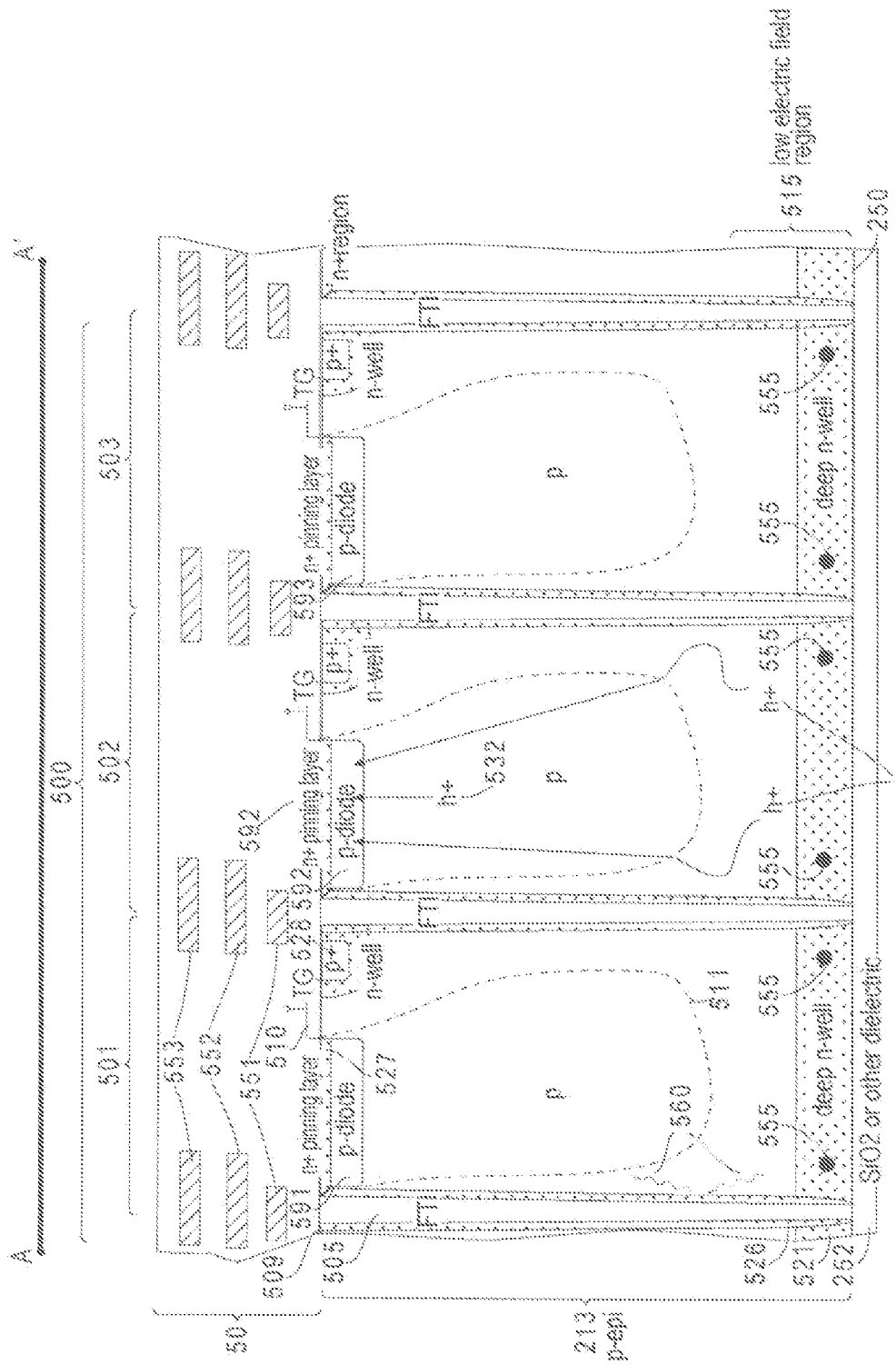
FIG. 8 is a cross-sectional view through line A-A' of FIG. 7.

FIG. 8 is a cross-sectional view through line A-A' of FIG. 7. Along this cross-section the FTI completely isolates the pixels 591, 592, 593. Within this cross-section, photo-generated charges 533 in the low electric field region 515 cannot diffuse into the adjacent pixel because of the FTI. Also, the index of refraction of the FTI 505 is much less than that of the silicon 213, therefore the FTI not only reduces electrical crosstalk, but also optical crosstalk by creating a waveguide for incident photons within the silicon (see 560).

Figure 9:
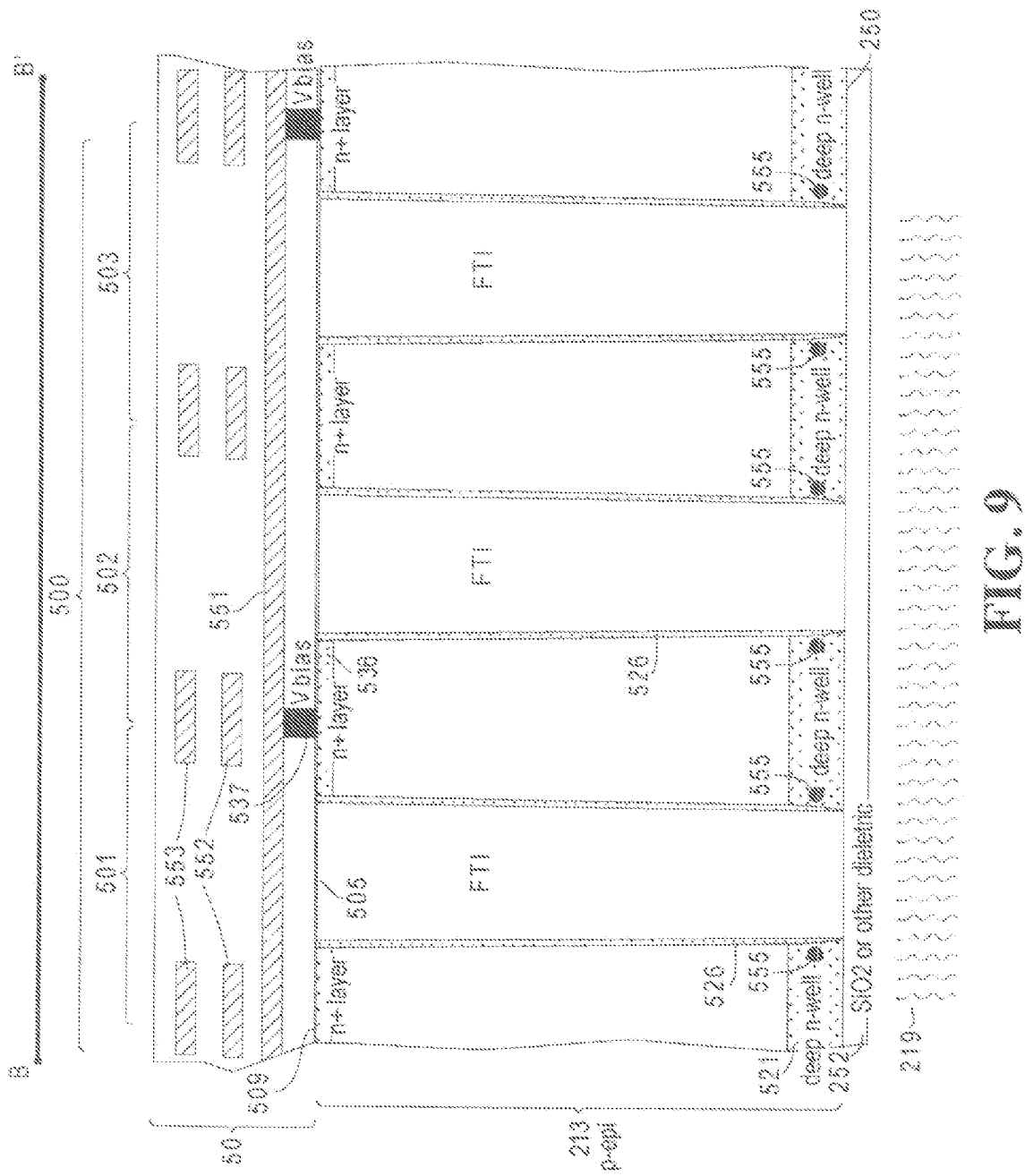
FIG. 9 is a cross-sectional view through line B-B' of FIG. 7.

FIG. 9 is a cross-sectional view between photodiodes (line B-B' of FIG. 7). Again the FTI 505 extends through to the active silicon layer 213. This structure also provides electrical connection between the frontside contact 537 and the deep n-well 521 through n-regions 526 and 536. Also the deep n-well regions in FIGS. 8 and 9 are not isolated from one another, but continuously connected. The FTI regions 505 include portions that do not extend to the insulating layer 252 so as to connect the deep n-well 521 at the backside between adjacent pixels. This is illustrated by the dashed line 580 in FIG. 7, and the solid black circles 555 in FIGS. 8 and 9. If the deep n-well 521 was not continuously connected, then the deep n-well would be electrically floating in some pixels. A floating deep n-well degrades lag and dark current performance.

Figure 10:
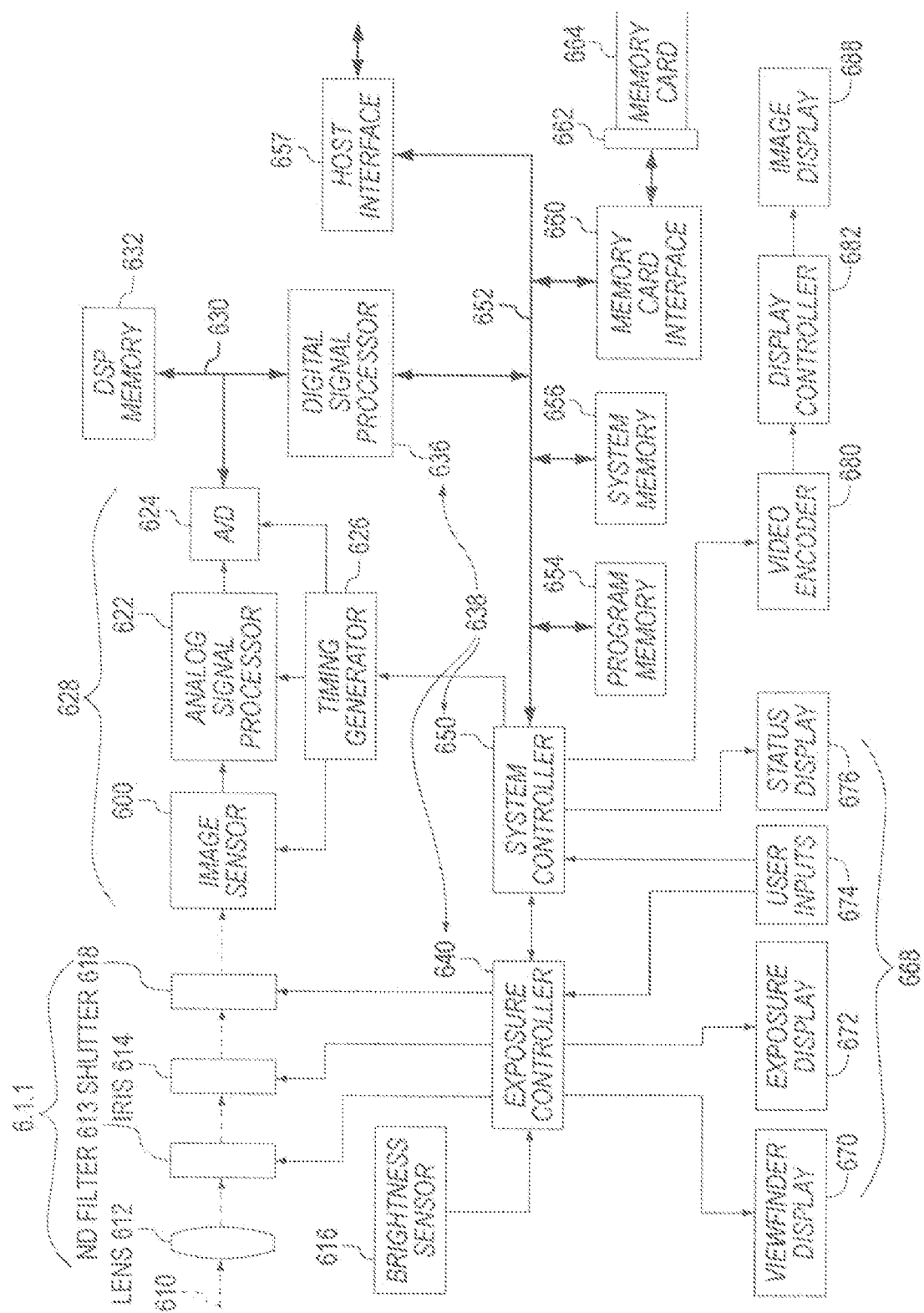
FIG. 10 is a block diagram conceptually illustrating an embodiment of an image capture device.

FIG. 10 is a block diagram illustrating an image capture device, such as a digital camera, embodying a back-illuminated image sensor such as the embodiments of the image sensor 400, 500 disclosed herein. Although a digital camera is illustrated and described, the present invention is clearly applicable to other types of image capture devices. In the disclosed camera, light 610 from a subject scene is input to an imaging stage 611, where the light is focused by a lens 612 to form an image on an image sensor 600. As noted above, the image sensor 600 converts the incident light to an electrical signal for each pixel of the image sensor 600.

The amount of light reaching the sensor 600 is regulated by an iris block 614 that varies the aperture and the neutral density (ND) filter block 613 that includes one or more ND filters interposed in the optical path. Also regulating the overall light level is the time that the shutter block 618 is open. The exposure controller block 640 responds to the amount of light available in the scene as metered by the brightness sensor block 616 and controls all three of these regulating functions.

This description of a particular camera configuration will be familiar to one skilled in the art, and it will be apparent to such a skilled person that many variations and additional features are present. For example, an autofocus system is added, or the lens is detachable and interchangeable. It will be understood that the present disclosure applies to various types of digital cameras where similar functionality is provided by alternative components. For example, the digital camera is a relatively simple point and shoot digital camera, where the shutter 618 is a relatively simple movable blade shutter, or the like, instead of the more complicated focal plane arrangement. Aspects of the present invention can also be practiced on imaging components included in non-camera devices such as mobile phones and automotive vehicles.

An analog signal from the image sensor 600 is processed by an analog signal processor 622 and applied to an analog to digital (A/D) converter 624. A timing generator 626 produces various clocking signals to select rows and pixels and synchronizes the operation of the analog signal processor 622 and the A/D converter 624. The image sensor stage 628 includes the image sensor 600, the analog signal processor 622, the A/D converter 624, and the timing generator 626. The components of the image sensor stage 628 can be separately fabricated integrated circuits, or they could be fabricated as a single integrated circuit as is commonly done with CMOS image sensors. The resulting stream of digital pixel values from the A/D converter 624 is stored in a memory 632 associated with the digital signal processor (DSP) 636.

The digital signal processor 636 is one of three processors or controllers in the illustrated embodiment, in addition to a system controller 650 and an exposure controller 640. Although this partitioning of camera functional control among multiple controllers and processors is typical, these controllers or processors are combined in various ways without affecting the functional operation of the camera and the application of the present invention. These controllers or processors can comprise one or more digital signal processor devices, microcontrollers, programmable logic devices, or other digital logic circuits. Although a combination of such controllers or processors has been described, it should be apparent that one controller or processor can be designated to perform all of the needed functions. All of these variations can perform the same function and fall within the scope of this invention, and the term "processing stage" will be used as needed to encompass all of this functionality within one phrase, for example, as in processing stage 638 in FIG. 10.

In the illustrated embodiment, the DSP 636 manipulates the digital image data in its memory 632 according to a software program permanently stored in program memory 654 and copied to the memory 632 for execution during image capture. The DSP 636 executes the software necessary for practicing image processing. The memory 632 includes of any type of random access memory, such as SDRAM. A bus 630 comprising a pathway for address and data signals connects the DSP 636 to its related memory 632, A/D converter 624 and other related devices.

The system controller 650 controls the overall operation of the camera based on a software program stored in the program memory 654, which can include Flash EEPROM or other nonvolatile memory. This memory can also be used to store image sensor calibration data, user setting selections and other data which must be preserved when the camera is turned off. The system controller 650 controls the sequence of image capture by directing the exposure controller 640 to operate the lens 612, ND filter 613, iris 614, and shutter 618 as previously described, directing the timing generator 626 to operate the image sensor 600 and associated elements, and directing the DSP 636 to process the captured image data. After an image is captured and processed, the final image file stored in memory 632 is transferred to a host computer via an interface 657, stored on a removable memory card 664 or other storage device, and displayed for the user on an image display 688.

A bus 652 includes a pathway for address, data and control signals, and connects the system controller 650 to the DSP 636, program memory 654, system memory 656, host interface 657, memory card interface 660 and other related devices. The host interface 657 provides a high speed connection to a personal computer (PC) or other host computer for transfer of image data for display, storage, manipulation or printing. This interface is an IEEE1394 or USB2.0 serial interface or any other suitable digital interface. The memory card 664 is typically a Compact Flash (CF) card inserted into a socket 662 and connected to the system controller 650 via a memory card interface 660. Other types of storage that are utilized include, for example, PC-Cards, MultiMedia Cards (MMC), or Secure Digital (SD) cards.

Processed images are copied to a display buffer in the system memory 656 and continuously read out via a video encoder 680 to produce a video signal. This signal is output directly from the camera for display on an external monitor, or processed by the display controller 682 and presented on an image display 688. This display is typically an active matrix color liquid crystal display (LCD), although other types of displays are used as well.

The user interface, including all or any combination of viewfinder display 670, exposure display 672, status display 676 and image display 688, and user inputs 674, is controlled by a combination of software programs executed on the exposure controller 640 and the system controller 650. User inputs 674 typically include some combination of buttons, rocker switches, joysticks, rotary dials or touchscreens. The exposure controller 640 operates light metering, exposure mode, autofocus and other exposure functions. The system controller 650 manages the graphical user interface (GUI) presented on one or more of the displays, for example, on the image display 688. The GUI typically includes menus for making various option selections and review modes for examining captured images.

The exposure controller 640 accepts user inputs selecting exposure mode, lens aperture, exposure time (shutter speed), and exposure index or ISO speed rating and directs the lens and shutter accordingly for subsequent captures. The brightness sensor 616 is employed to measure the brightness of the scene and provide an exposure meter function for the user to refer to when manually setting the ISO speed rating, aperture and shutter speed. In this case, as the user changes one or more settings, the light meter indicator presented on viewfinder display 670 tells the user to what degree the image will be over or underexposed. In an automatic exposure mode, the user changes one setting and the exposure controller 640 automatically alters another setting to maintain correct exposure. For example, for a given ISO speed rating when the user reduces the lens aperture, the exposure controller 640 automatically increases the exposure time to maintain the same overall exposure.

The invention has been described in detail with particular reference to certain preferred embodiments thereof, but it will be understood that variations and modifications can be effected within the spirit and scope of the invention.

PARTS LIST 2 p++ Substrate
3 p-epi
4 Silicon Wafer
5 Shallow Trench Isolation
8 Surface indicating Vertical Overflow Drain
9 Frontside surface of the Active Layer
10 Transfer Gate
11 Depletion Region Boundary
19 Frontside Incident Light
21 Deep n-well
26 n passivation of STI
27 n+ Pinning Layer
28 p+ Floating Diffusion
29 Shallow n-well (in imager area)
30 Region of n-type implant of moderate energy
31 Photocarriers collected by nearby photodiode
32 Photocarriers on the photodiode side of the vertical overflow drain
33 Photocarriers opposite the photodiode side of the vertical overflow drain
37 Electrical Contact to the n-well
50 Circuit Layer
51 Metal Wiring
52 Metal Wiring
53 Metal Wiring
91 Photodiode
92 Photodiode
93 Photodiode
100 Image Array
101 Pixel
102 Pixel
103 Pixel
140 Shallow n-well for standard CMOS process
141 Shallow p-well for standard CMOS process
142 pmos Transistor
143 nmos Transistor
172 Reset Gate
173 Source/Follower Gate
174 Source/Follower Output Line
200 Image Array
201 Pixel
202 Pixel
203 Pixel
211 Depletion Region Boundary
213 p-epi layer (Active Silicon Layer)
215 Low Electric Field Region
219 Backside Incident Light
221 Deep n-well
232 Photocarriers collected by nearest photodiode
233 Photocarriers collected by neighboring photodiode
250 Backside Silicon/Dielectric Interface
252 Backside Dielectric Layer
300 Image Array
301 Pixel
302 Pixel
303 Pixel
311 Depletion Region Boundary
313 p-epi layer (Active Silicon Layer)
315 Low Electric Field Region
321 Deep n-well
332 Photocarriers collected by nearest photodiode
333 Photocarriers collected by neighboring photodiode
340 Additional n-type Implant for Connecting shallow and deep n-wells
341 Additional n-type Implant for Connecting shallow and deep n-wells
342 Additional n-type Implant for Connecting shallow and deep n-wells
400 Image Array
401 Pixel
402 Pixel
403 Pixel
405 Deep Trench Isolation
409 Frontside surface of the Active Layer
410 Transfer Gate
411 Depletion Region Boundary
415 Low Electric Field Region
421 Deep n-well 426 n passivation of DTI
428 p+ Floating Diffusion
429 Shallow n-well (in imager area)
432 Photocarriers collected by nearest photodiode
433 Photocarriers collected below Depletion Region and collected by nearest photodiode
437 Electrical Contact to the n-well
451 Metal Wiring
452 Metal Wiring
453 Metal Wiring
491 Photodiode
492 Photodiode
493 Photodiode
500 Image Array
501 Pixel
502 Pixel
503 Pixel
505 Full Trench Isolation
509 Frontside surface of the Active Layer
510 Transfer Gate
511 Depletion Region Boundary
515 Low Electric Field Region
521 Deep n-well
526 n passivation of FTI
527 n+ Pinning Layer
528 p+ Floating Diffusion
536 n+ layer between photodiodes
532 Photocarriers collected by nearest photodiode
533 Photocarriers collected below Depletion Region and collected by nearest photodiode
537 Electrical Contact to the n-well
551 Metal Wiring
552 Metal Wiring
553 Metal Wiring
555 Identifiers of continuous connectivity in the Deep n-well
560 Internally Reflected Photodiode
572 Reset Gate
573 Source/Follower Gate
574 Source/Follower Output Line
580 Dashed Line marking path of continuous connectivity in the Deep n-well
591 Photodiode
592 Photodiode
593 Photodiode
600 Back-illuminated image sensor
610 Light
611 Imaging stage
612 Lens
613 ND filter block
614 Iris block
616 Brightness sensor block
618 Shutterblock
622 Analog signal processor
624 Analog to digital (A/D) converter
626 Timing generator
628 Image sensor stage
630 Bus
632 Memory
636 Digital signal processor (DSP)
368 Processing stage
640 Exposure controller
650 System controller
652 Bus
654 Program memory
656 System memory
657 Host interface
660 Memory card interface
662 Socket
664 Memory card
670 Viewfinder display
672 Exposure display
674 User inputs
676 Status display
680 Video encoder
682 Display controller
688 Image display

The invention claimed is:

1. A back-illuminated image sensor, comprising:
a sensor layer having a frontside and a backside opposite the frontside;
an insulating layer adjacent the backside;
a circuit layer adjacent the frontside;
a plurality of photodetectors of a first type conductivity for converting light incident on the backside into photo-generated charges, the photodetectors having a depletion region, wherein the plurality of photodetectors are disposed in the sensor layer adjacent the frontside;
a region of a second type conductivity formed in at least a portion of the sensor layer adjacent the frontside and connected to a voltage terminal for biasing the second type conductivity region at a predetermined voltage;
a well of the second type conductivity formed in the sensor layer adjacent the backside; and
trench isolations in the sensor layer starting at the frontside and extending beyond the depletion region of the photodetectors and to portions of the insulating layer, wherein the trench isolations include portions that do not extend to the insulating layer so as to connect the well at the backside between adjacent photodetectors; and
a lining of the second type conductivity lining the trench isolations, wherein the lining electrically connects the region of the second type conductivity adjacent the frontside with the well adjacent the backside.

2. The back-illuminated image sensor of claim 1, wherein the first type conductivity is positive.

3. The back-illuminated image sensor of claim 1, wherein the second type conductivity is negative.

4. The back-illuminated image sensor of claim 1, wherein the photodetectors are formed in a p-epi substrate.

5. The back-illuminated image sensor of claim 1, wherein the region of the second type conductivity formed in at least a portion of the sensor layer adjacent the frontside is an n-well.

6. A method for producing a back-illuminated image sensor, comprising:
providing a sensor layer having a frontside and a backside opposite the frontside;
situating an insulating layer adjacent the backside;
situating a circuit layer adjacent the frontside;
providing a plurality of photodetectors of a first type conductivity for converting light incident on the backside into photo-generated charges, the photodetectors having a depletion region, wherein the plurality of photodetectors are disposed in the sensor layer adjacent the frontside;
forming a region of a second type conductivity in at least a portion of the sensor layer adjacent the frontside;
biasing the second type conductivity region at a predetermined voltage;
forming a well of the second type conductivity in the sensor layer adjacent the backside; and
providing trench isolations in the sensor layer starting at the frontside and extending beyond the depletion region of the photodetectors and to portions of the insulating layer, wherein the trench isolations include portions that do not extend to the insulating layer so as to connect the well at the backside between adjacent photodetectors; and providing a lining of the second type conductivity lining the trench isolations, wherein the lining electrically connects the region of the second type conductivity adjacent the frontside with the well adjacent the backside.

7. The method of claim 6, wherein the first type conductivity is positive.

8. The method of claim 6, wherein the second type conductivity is negative.

9. An image capture device, comprising:
a lens configured to receive light;
a back-illuminated image sensor including:
   a sensor layer having a frontside and a backside opposite the frontside;
   an insulating layer adjacent the backside;
   a circuit layer adjacent the frontside;
   a plurality of photodetectors of a first type conductivity for converting light from the lens incident on the backside into photo-generated charges, the photodetectors having a depletion region, wherein the plurality of photodetectors are disposed in the sensor layer adjacent the frontside;
   a region of a second type conductivity formed in at least a portion of the sensor layer adjacent the frontside and connected to a voltage terminal for biasing the second type conductivity region at a predetermined voltage;
   a well of the second type conductivity formed in the sensor layer adjacent the backside; and
   trench isolations in the sensor layer starting at the frontside and extending beyond the depletion region of the photodetectors and to portions of the insulating layer. wherein the trench isolations include portions that do not extend to the insulating layer so as to connect the well at the backside between adjacent photodetectors; and
   a lining of the second type conductivity lining the trench isolations, wherein the lining electrically connects the region of the second type conductivity adjacent the frontside with the well adjacent the backside.

10. The image capture device of claim 9, wherein the first type conductivity is positive.

11. The image capture device of claim 9, wherein the second type conductivity is negative.

12. The image capture device of claim 9, wherein the photodetectors are formed in a p-epi substrate.

13. The image capture device of claim 9, wherein the region of the second type conductivity formed in at least a portion of the sensor layer adjacent the frontside is an n-well.

* * * * *